(12) United States Patent
Kim

(10) Patent No.: US 7,915,628 B2
(45) Date of Patent: Mar. 29, 2011

(54) LIGHT EMITTING DEVICE AND METHOD OF MANUFACTURING THE SAME

(75) Inventor: Hee Jin Kim, Gwangju-si (KR)

(73) Assignee: LG Innotek Co., Ltd., Seoul (KR)

( * ) Notice: Subject to any disclaimer, the term of this patent is extended or adjusted under 35 U.S.C. 154(b) by 333 days.

(21) Appl. No.: 12/123,801

(22) Filed: May 20, 2008

(65) Prior Publication Data

US 2008/0290361 A1 Nov. 27, 2008

(30) Foreign Application Priority Data

May 21, 2007 (KR) .................. 10-2007-0049025

(51) Int. Cl.
*H01L 33/00* (2010.01)
(52) U.S. Cl. ..... 257/98; 257/103; 257/79; 257/E33.002; 257/E33.012; 257/E33.013; 257/E33.028
(58) Field of Classification Search ............... 257/198, 257/98, 103, 79, E33.002, E33.012, E33.013, 257/E33.028
See application file for complete search history.

(56) References Cited

U.S. PATENT DOCUMENTS

| | | | |
|---|---|---|---|
| 2006/0260671 A1* | 11/2006 | Ohta et al. | 136/249 |
| 2007/0290224 A1* | 12/2007 | Ogawa | 257/103 |

* cited by examiner

*Primary Examiner* — Ngan Ngo
*Assistant Examiner* — Benjamin Tzu-Hung Liu
(74) *Attorney, Agent, or Firm* — Birch, Stewart, Kolasch & Birch, LLP

(57) ABSTRACT

A light emitting device comprises a first conductive semiconductor layer, an active layer on the first conductive semiconductor layer, a refractive layer on the active layer, and a second conductive semiconductor layer on the refractive layer.

18 Claims, 4 Drawing Sheets

LIGHT EMITTING DEVICE AND METHOD OF MANUFACTURING THE SAME

CROSS-REFERENCE TO RELATED APPLICATIONS

The present application claims priority under 35 U.S.C. 119 and 35 U.S.C. 365 to Korean Patent Application No. 10-2007-0049025 (filed on May 21, 2007), which is hereby incorporated by reference in its entirety.

BACKGROUND

The present disclosure relates to a light emitting device and a method of manufacturing the same.

Recently, light emitting diodes that use nitride semiconductors as light emitting devices have been widely used.

A typical light emitting diode is formed by stacking an N-type semiconductor layer, an active layer, and a P-type semiconductor layer. As electric power is applied to the N-type and P-type semiconductor layers, the active layer emits light to an external side.

Meanwhile, not all the light generated by the active layer is emitted to the external side. That is, the light generated by the active layer partly disappears in the light emitting diode. Therefore, a variety of studies aimed at solving this problem have been conducted.

SUMMARY

Embodiments provide a light emitting device that is designed to be improved in light emitting efficiency and a method of manufacturing the light emitting device.

Embodiments also provide a light emitting device that is designed to increase an amount of light emitted upward and a method of manufacturing the light emitting device.

In an embodiment, a light emitting device comprises a first conductive semiconductor layer, an active layer on the first conductive semiconductor layer, a refractive layer on the active layer, and a second conductive semiconductor layer on the refractive layer.

In an embodiment, a light emitting device comprises a substrate, a first conductive semiconductor layer on the substrate, an active layer on the first conductive semiconductor layer, a refractive layer on the active layer, and a second conductive semiconductor layer on the refractive layer.

The details of one or more embodiments are set forth in the accompanying drawings and the description below. Other features will be apparent from the description and drawings, and from the claims.

DETAILED DESCRIPTION OF THE EMBODIMENTS

Figure 1:
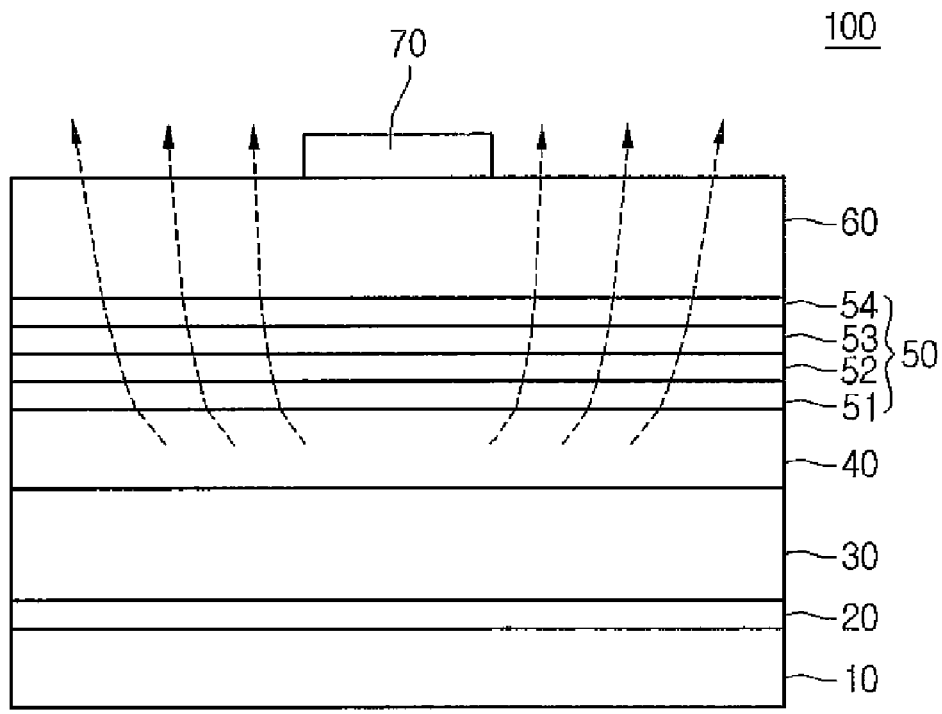
FIG. 1 is a schematic view of a light emitting device according to an embodiment of the present invention.

Reference will now be made in detail to the embodiments of the present disclosure, examples of which are illustrated in the accompanying drawings.

In the following description, it will be understood that when a layer (or film) is referred to as being 'on' another layer or substrate, it can be directly on the other layer or substrate, or intervening layers may also be present. Further, it will be understood that when a layer is referred to as being 'under' another layer, it can be directly under the other layer, and one or more intervening layers may also be present. In addition, it will also be understood that when a layer is referred to as being 'between' two layers, it can be the only layer between the two layers, or one or more intervening layers may also be present.

In the drawings, the dimensions of layers and regions are exaggerated for clarity of illustration.

In embodiments, a first conductive semiconductor layer may be one of N-type and P-type semiconductor layers and a second conductive semiconductor layer may be the other of the N-type and P-type semiconductor layers.

Hereinafter, embodiments of the present invention will be described in more detail with reference to the accompanying drawings.

FIG. 1 illustrates a light emitting device according to an embodiment of the present invention.

Referring to FIG. 1, a light emitting device 100 includes a first electrode layer 10, a reflective layer 20, a first conductive semiconductor layer 30, an active layer 40, a refractive layer 50, a second conductive semiconductor layer 60, and a second electrode layer 70.

The first electrode layer 10 may be formed of metal including at least one of Cu, Ag, Ti, Ni, Au, and Al, and can include a conductive support substrate.

Here, an adhesive layer can be further included between the conductive support substrate and the reflective layer 20.

The reflective layer 20 may include at least one of Ni, Ag, Cu, Al, and Ti layers. In the embodiment, the reflective layer 20 includes the Ni, Ag, Ni, and Cu layers that are sequentially stacked on one another.

The reflective layer 20 reflects the light generated by the active layer 40 upward to increase light emitting efficiency of the light emitting device 100.

The first conductive semiconductor layer 30 may be a P-type semiconductor layer. In the embodiment, the first conductive semiconductor layer 30 is a P-type GaN layer doped with Mg.

The active layer 40 emits light by an electron-hole combination. The active layer 40 may be formed in one of a single quantum well structure or a multiple quantum well structure. For example, the active layer 40 may be formed in an InGaN well layer/InGaN barrier layer structure.

The refractive layer 50 may be formed in a single or multiple layer structure having a different refraction index from the active layer 40 and the second conductive semiconductor layer 60.

In the embodiment of FIG. 1, the refractive layer 50 includes first, second, third, and fourth reflective layers 51, 52, 53, and 54.

The refractive layer 50 may be formed of $Al_xGa_{1-x}N$. In this case, the refractive index of the refractive layer 50 varies depending on an amount of Al. That is, when the amount of Al increases, the refractive index of the refractive layer 50 increases.

For example, the value "x" of the first refractive layer 51 is greater than 0.02 and less than or equal to 0.04 and the value "x" of the second refractive layer 52 is greater than 0.04 and less than or equal to 0.06. In addition, the value "x" of the third refractive layer 53 is greater than 0.06 and less than or equal to 0.08 and the value "x" of the fourth refractive layer 54 is greater than 0.08 and less than or equal to 0.1.

Therefore, the first refractive layer 51 has the refractive index of 2.6-2.7 for blue light and the second refractive layer 52 has the refractive index of 2.7-2.8 for the blue light. In addition, the third refractive layer 53 has the refractive index of 2.8-2.9 for the blue light and the fourth refractive layer 54 has the refractive index of 2.9-3.0 for the blue light.

In another embodiment, the refractive layer 50 includes first, second and third reflective layers. The first refractive layer has the refractive index of 2.6-2.7 for blue light and the second refractive layer has the refractive index of 2.7-2.8 for the blue light. In addition, the third refractive layer has the refractive index of 2.8-3.0 for the blue light.

The active layer 40 has the refractive index of about 2.5. Therefore, the refractive layer 50 has the greater refractive index than the active layer 40.

Meanwhile, when the value "x" of $Al_xGa_{1-x}N$ is 0.2 or more, the refractive index becomes greater than 3.5 and thus the reflection of the light increases. Therefore, the value "x" may be less than 0.2.

The refractive layer 50 is designed to be gradually increased in the refractive index as it goes toward the second conductive semiconductor layer 60.

When the refractive index of an upper layer is greater than that of a lower layer, a refraction angle of the light traveling from the lower layer to the upper layer becomes less than an incident angle.

Therefore, since the refraction angle is reduced, the traveling direction of the light gradually changes to a vertical direction as the light passes through the refractive layer 50.

The second conductive semiconductor layer 60 may be an N-type semiconductor layer. In the embodiment, the second conductive semiconductor layer 60 may be an N-type GaN layer doped with Si.

The second electrode layer 70 may be formed of metal including at least one of Cu, Ag, Ti, Ni, Au, and Al.

Meanwhile, the refractive index of the second conductive semiconductor 60 is about 2.5 and the refractive index of the air above the second conductive semiconductor layer 60 is about 1. Therefore, an incident angle of the light to the air must be 23.6 degrees or less so that the light is emitted to the air through the second conductive semiconductor layer 60

When the incident angle of the light to the air is greater than 23.6, the light is reflected on a boundary surface between the second conductive semiconductor layer 60 and the air and travels back to the light emitting device 100. The light may disappears in the light emitting device 100.

Therefore, in this embodiment, the reflective layer 20 and the refractive layer 50 are formed so as to allow the light generated by the active layer 40 to be fully emitted to the external side without disappearing in the light emitting device 100.

Specifically, the refractive layer 50 reduces the refraction angle of the light traveling upward, thereby increasing the possibility that the incident angle of the light on the air through the second conductive semiconductor layer 60 is 23.6 degrees or less.

Figure 2:
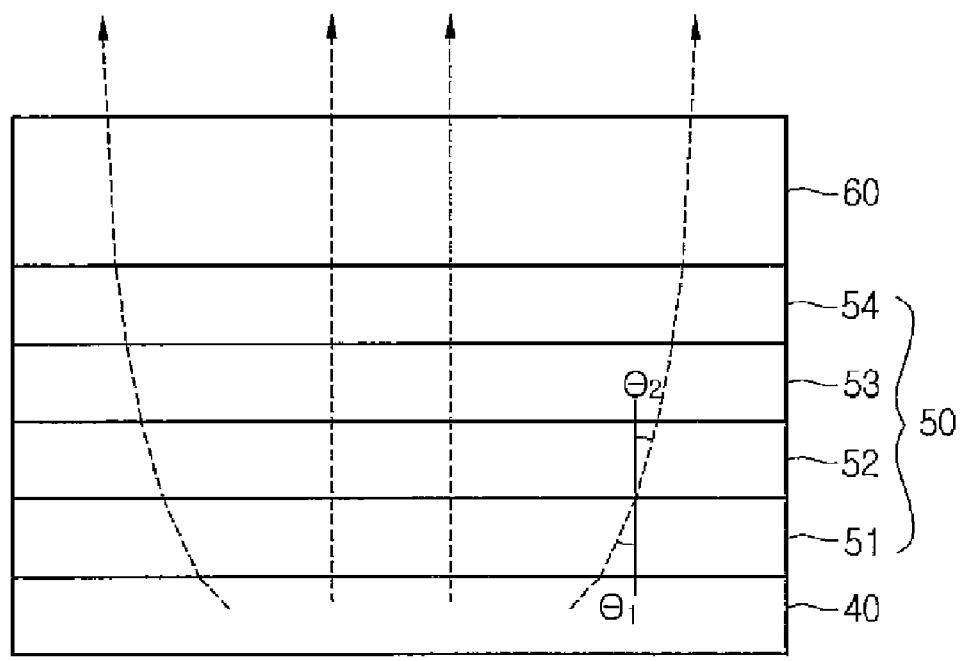
FIG. 2 illustrates variations of an incident angle and a refraction angle of light by a refractive layer.

FIG. 2 illustrates variations of the incident angle and refraction angle of the light by the refractive layer.

Referring to FIG. 2, the refraction layer 50 includes a plurality of layers whose refractive indexes gradually increase upward. In this embodiment, the refractive layer 50 includes the first refractive layer 51 having the refractive index of 2.6-2.7, the second refractive layer 52 having the refractive index of 2.7-2.8, the third refractive layer 53 having the refractive index of 2.8-2.9, and the fourth refractive layer 54 having the refractive index of 2.9-3.0.

Since the second refractive layer 52 has the greater refractive index that the first refractive layer 51, a refraction angle $\theta_2$ of the light incident on a boundary surface between the first and second refractive layers 51 and 52 is less than an incident angle $\theta_1$.

Therefore, the refraction angle of the light generated by the active layer 40 is gradually reduced as it passes through the refractive layer 50 and thus an amount of the light incident on the air through the second conductive semiconductor layer 60 may increase.

Figure 3:
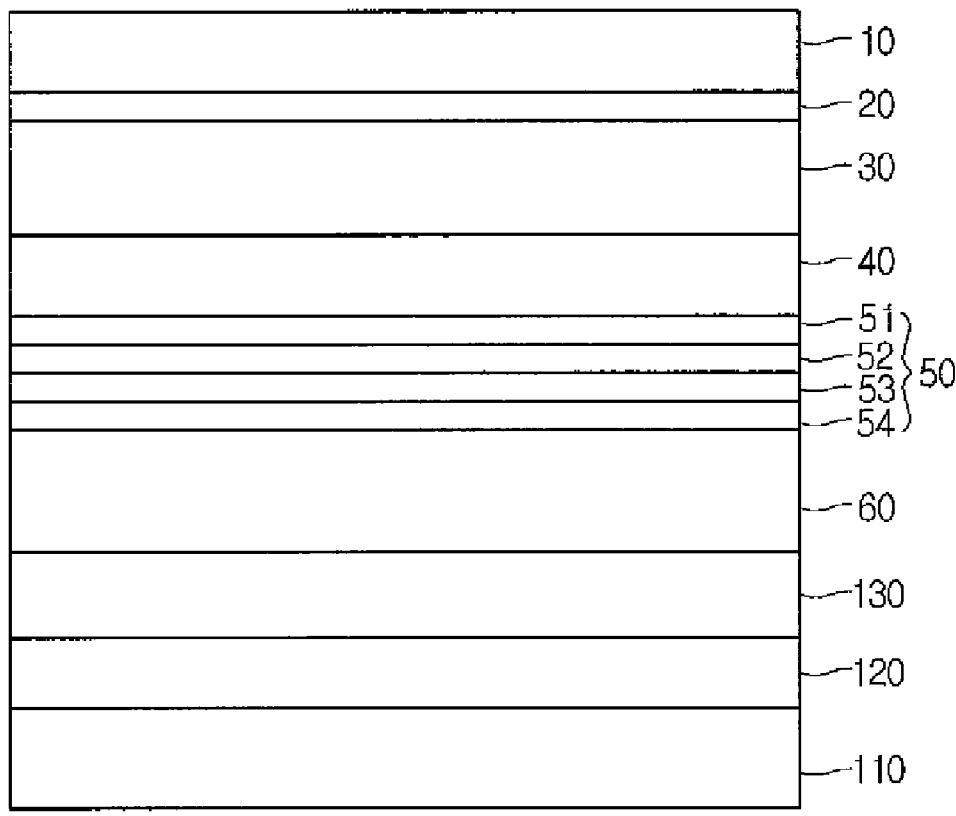
FIGS. 3 to 5 are schematic views illustrating a method of manufacturing a light emitting device according to an embodiment of the present invention.
Figure 4:
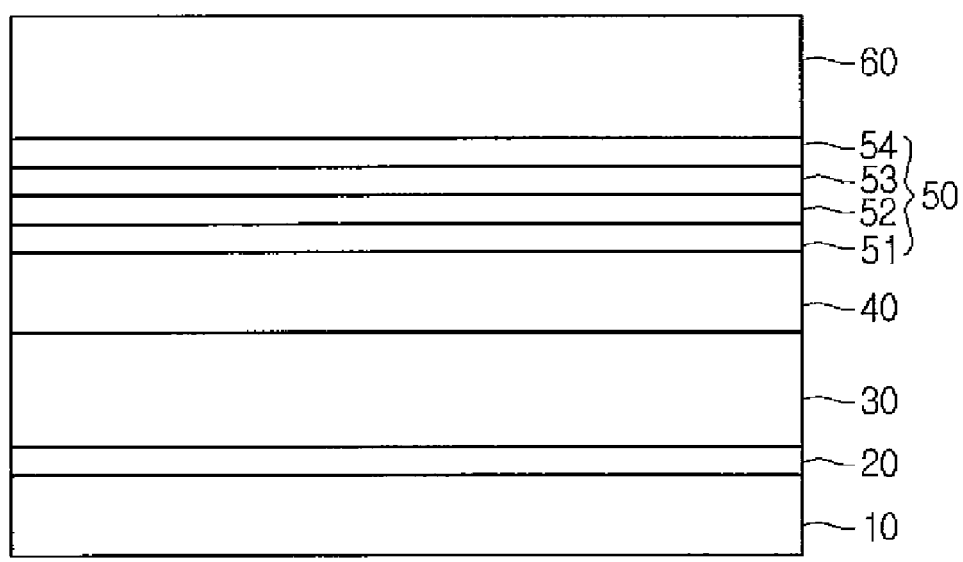
Figure 5:
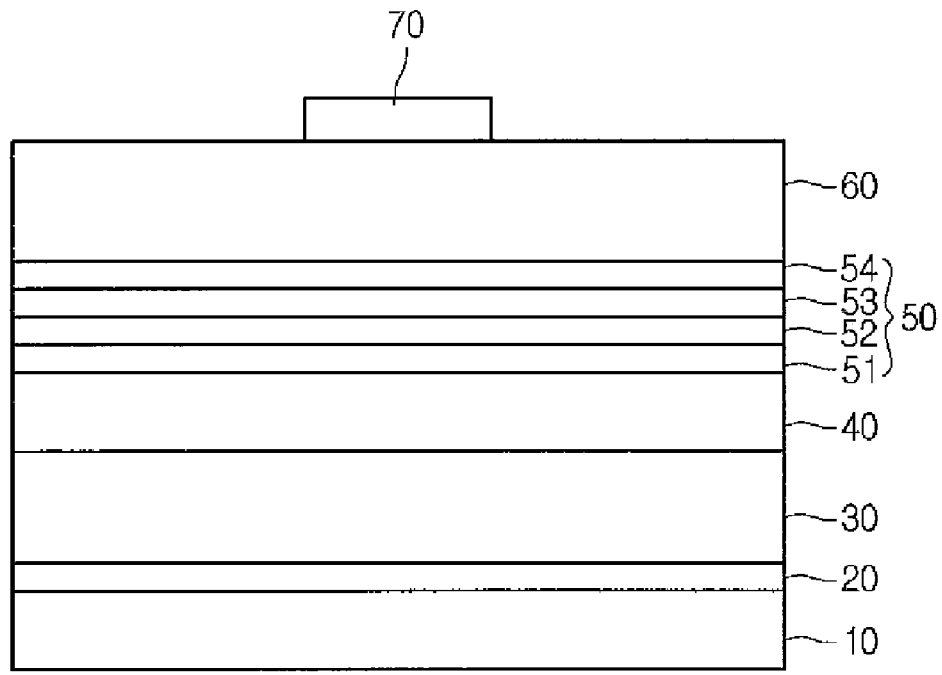

FIGS. 3 to 5 are schematic views illustrating a method of manufacturing a light emitting device according to an embodiment of the present invention.

Referring to FIGS. 3 and 4, a substrate 110 is first prepared and the buffer layer 120 is formed on the substrate 110.

The substrate 110 may be formed of one of sapphire $(Al_2O_3)$, silicon carbide (SiC), silicon (Si), gallium arsenic (GaAs), zinc oxide (ZnO), and magnesium oxide (MgO). The buffer layer 120 may be formed of one of an AlInN structure, an AlInN/GaN layer structure, an $In_xGa_{1-x}N/GaN$ layer structure, and an $Al_xIn_yGa_{1-(x+y)}N/In_xGa_{1-x}N/GaN$ layer structure.

An un-doped GaN layer 130 is formed on the buffer layer 120.

The un-doped GaN layer 130 is formed by applying a tri-methyl gallium and $NH_3$. At this point, purge gas and carrier gas are used as $N_2$ and $H_2$.

The second conductive semiconductor layer 60, the refractive layer 50, the active layer 40, and the first conductive semiconductor layer 30 are sequentially formed on the un-doped GaN 130.

The refractive layer 50 may be formed with a plurality of layers having different refractive indexes. In this embodiment, the refractive layer 50 is formed by sequentially forming the fourth refractive layer 54 having a refractive index of 2.9-3.0, the third refractive layer 53 having a refractive index of 2.8-2.9, the second refractive layer 52 having a refractive index of 2.7-2.8, and the first refractive layer 51 having a refractive index of 2.6-2.7.

Meanwhile, the reflective layer 20 and the first electrode layer 10 are formed on the first conductive semiconductor layer 30.

The reflective layer 20 is formed by depositing Ni, Ag, Cu, Al, and Ti using an E-beam apparatus. The first electrode layer 10 is formed on the reflective layer 20.

Here, the first electrode layer 10 can include a conductive support substrate. That is, the conductive support substrate is formed on the reflective layer 20, and a first electrode can be formed on the conductive support substrate. An adhesive layer can be formed to connect the conducive support substrate with the reflective layer 20.

Next, as shown in FIG. 4, the substrate 110, the buffer layer 120, and the un-doped GaN layer 130 are removed.

Subsequently, as shown in FIG. 5, a second electrode layer 70 is formed on the second conductive semiconductor layer 60. Therefore, the light emitting device as shown in FIG. 1 is manufactured.

In this embodiment, the first and second electrode layers 10 and 70 are arranged to be perpendicular to each other. The reflective layer 20, the first conductive semiconductor layer 30, the active layer 40, the refractive layer 50, and the second conductive semiconductor layer 60 are formed between the first and second electrodes 10 and 70. However, the present invention is not limited to this embodiment.

Figure 6:
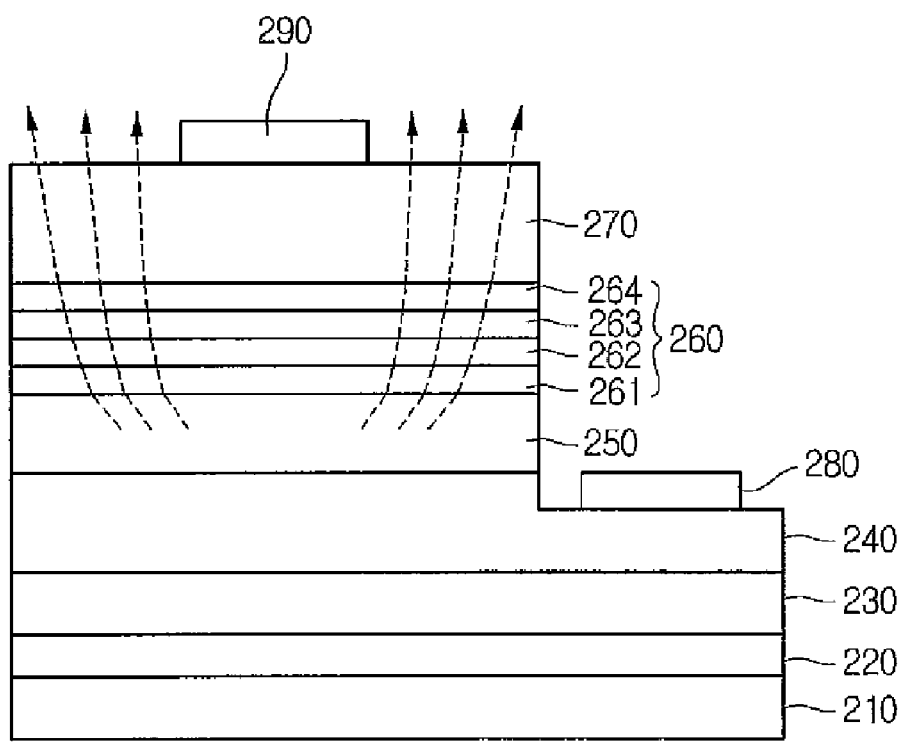
FIG. 6 is a schematic view of a light emitting device according to another embodiment of the present invention.

FIG. 6 is a schematic view of a light emitting device according to another embodiment of the present invention.

An embodiment of FIG. 6 is similar to the embodiment of FIGS. 1 and 2. Therefore, similar or like parts will not be described in detail.

A light emitting device of this embodiment includes a buffer layer 220, an un-doped GaN layer 230, a second conductive semiconductor layer 240, an active layer 250, a refractive layer 260, and a first conductive semiconductor layer 270 on a substrate 210.

A second electrode layer 280 is formed on the second conductive semiconductor layer 240, and a first electrode layer 290 is formed on the first conductive semiconductor layer 270.

The second conductive semiconductor layer 240 may be, for example, a GaN layer doped with N-type impurities such as Si. The first conductive semiconductor layer 270 may be, for example, a GaN layer containing P-type impurities such as Mg.

The refractive layer 260 may be formed in a single or multiple layer structure having a different refractive index from the active layer 250 and the first conductive semiconductor layer 270.

In the embodiment of FIG. 6, the refractive layer 260 includes first, second, third, and fourth reflective layers 261, 262, 263, and 264.

The refractive layer 260 may be formed of $Al_xGa_{1-x}N$. In this case, the refractive index of the refractive layer 260 varies depending on an amount of Al. That is, when the amount of Al increases, the refractive index of the refractive layer 260 increases.

For example, the value "x" of the first refractive layer 261 is greater than 0.02 and less than or equal to 0.04 and the value "x" of the second refractive layer 262 is greater than 0.04 and less than or equal to 0.06. In addition, the value "x" of the third refractive layer 263 is greater than 0.06 and less than or equal to 0.08 and the value "x" of the fourth refractive layer 264 is greater than 0.08 and less than or equal to 0.1.

Therefore, the first refractive layer 261 has the refractive index of 2.6-2.7 for blue light and the second refractive layer 262 has the refractive index of 2.7-2.8 for the blue light. In addition, the third refractive layer 263 has the refractive index of 2.8-2.9 for the blue light and the fourth refractive layer 264 has the refractive index of 2.9-3.0 for the blue light.

In another embodiment, the refractive layer 260 includes first, second and third reflective layers. The first refractive layer has the refractive index of 2.6-2.7 for blue light and the second refractive layer has the refractive index of 2.7-2.8 for the blue light. In addition, the third refractive layer has the refractive index of 2.8-3.0 for the blue light.

The active layer 250 has the refractive index of about 2.5, Therefore, the refractive layer 260 has the greater refractive index than the active layer 250.

Meanwhile, when the value "x" of $Al_xGa_{1-x}N$ is 0.2 or more, the refractive index becomes greater than 3.5 and thus the reflection of the light increases. Therefore, the value "x" may be less than 0.2.

Unlike the previous embodiment, the refractive layer 260 is designed to be gradually increased in the refractive index as it goes toward the first conductive semiconductor layer 270.

When the refractive index of an upper layer is greater than that of a lower layer, a refraction angle of the light traveling from the lower layer to the upper layer becomes less than an incident angle.

Therefore, since the refraction angle is reduced, the traveling direction of the light gradually changes to a vertical direction as the light passes through the refractive layer 260.

Figure 7:
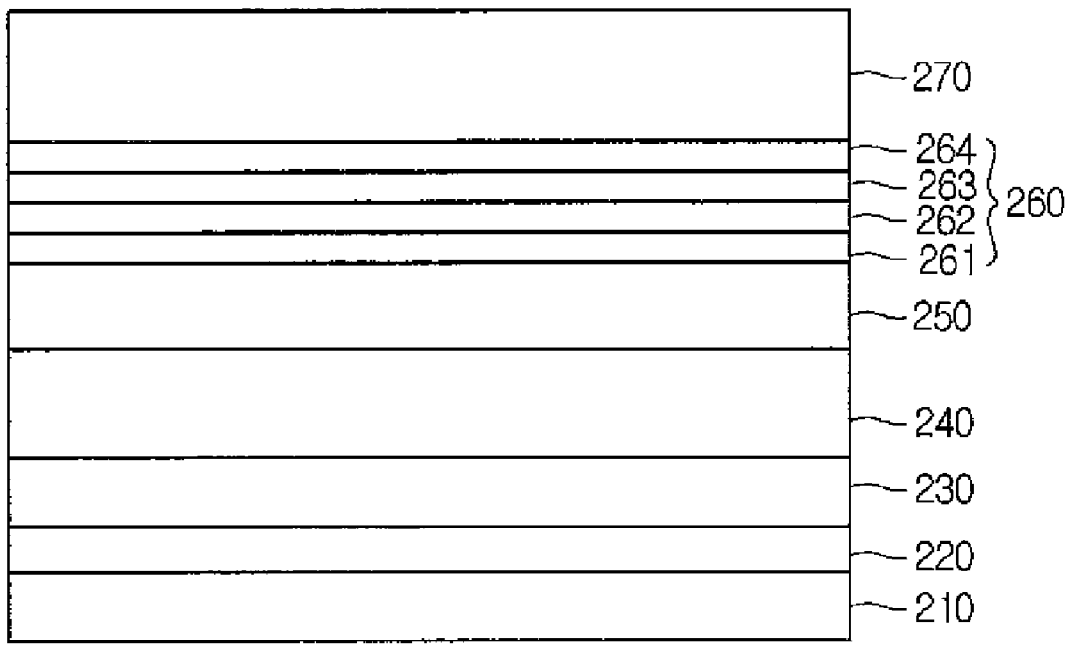
FIGS. 7 and 8 are schematic views illustrating a method of manufacturing a light emitting device according to another embodiment of the present invention.
Figure 8:
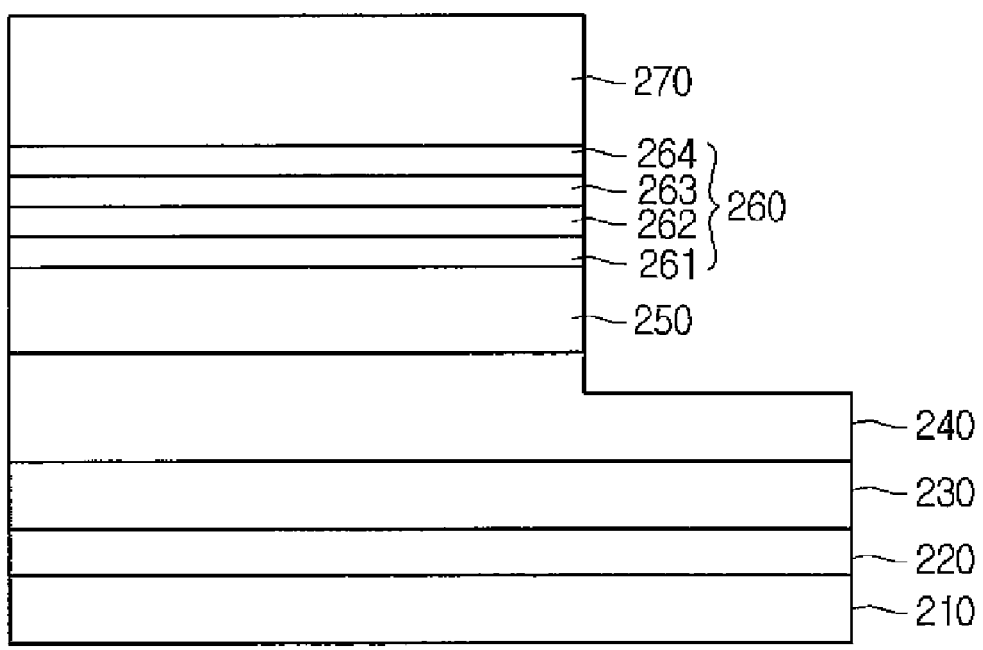

FIGS. 7 and 8 are schematic views illustrating a method of manufacturing a light emitting device according to another embodiment of the present invention.

Referring to FIG. 7, the buffer layer 220, the un-doped GaN layer 230, the second conductive semiconductor layer 240, the active layer 250, the refractive layer 260, and the first conductive semiconductor layer 270 are sequentially formed on a substrate 210

The refractive layer 260 may be formed with a plurality of layers having different refractive indexes. In this embodiment, the refractive layer 260 is formed by sequentially forming the first refractive layer 261 having a refractive index of 2.6-2.7, the second refractive layer 262 having a refractive index of 2.7-2.8, the third refractive layer 263 having a refractive index of 2.8-2.9, and the fourth refractive layer 264 having a refractive index of 2.9-3.0.

Referring to FIG. 8, the first conductive semiconductor layer 270, the refractive layer 260, the active layer 250, and the second conductive semiconductor layer 240 are selectively etched to partly expose the second conductive semiconductor layer 240.

Further, as shown in FIG. 6, the second electrode 280 is formed on the second conductive semiconductor layer 240, and the first electrode layer 290 is formed on the first conductive semiconductor layer 270.

Therefore, the light emitting device of this embodiment is manufactured.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fail within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a first conductive semiconductor layer;
   an active layer on the first conductive semiconductor layer;
   a refractive layer on the active layer; and
   a second conductive semiconductor layer on the refractive layer,
   wherein the refractive layer includes a plurality of refractive layers having different refractive indexes, the refractive layer is gradually increased in a refractive index incrementally towards the second conductive semiconductor layer, and wherein a difference of the refractive indexes between two refractive layers adjacent to each other is less than or equal to 0.2.

2. The light emitting device according to claim 1, comprising a reflective layer under the first conductive semiconductor layer.

3. The light emitting device according to claim 2, comprising a conductive support substrate under the reflective layer.

4. The light emitting device according to claim 1, comprising a first electrode layer under the first conductive semiconductor layer and a second electrode layer formed on the second conductive semiconductor layer.

5. The light emitting device according to claim 1, wherein the refractive layer is formed of $Al_xGa_{1-x}N$.

6. The light emitting device according to claim 5, wherein a value "x" in the $Al_xGa_{1-x}N$ is less than 0.2.

7. The light emitting device according to claim 5, wherein a value "x" in the $Al_xGa_{1-x}N$ is greater than 0.02 but less than or equal to 0.1.

8. The light emitting device according to claim 1, wherein the refractive layer has a greater refractive index than the active layer.

9. The light emitting device according to claim 1, comprising a first electrode layer on the first conductive semiconductor layer and a second electrode layer on the second conductive semiconductor layer.

10. The light emitting device according to claim 1, wherein the active layer emits a blue light, and wherein the refractive layer has a refractive index of 2.6-3.0 for the blue light.

11. The light emitting device according to claim 1, wherein the plurality of refractive layers comprise a first refractive layer having a first refractive index and a second refractive layer having a second refractive index, wherein the second refractive index is greater than the first refractive index and the second refractive layer is formed above the first refractive layer.

12. The light emitting device according to claim 1, wherein a conductive type of the first conductive semiconductor layer is opposite to that of the second conductive semiconductor layer.

13. The light emitting device according to claim 1, wherein the refractive layer is disposed directly on the active layer.

14. A light emitting device comprising:
a substrate;
a first conductive semiconductor layer on the substrate;
an active layer on the first conductive semiconductor layer;
a refractive layer on the active layer; and
a second conductive semiconductor layer on the refractive layer,
wherein the refractive layer is formed with a plurality of refractive layers having different refractive indexes, the refractive indexes increasing incrementally toward the second conductive semiconductor layer, and
wherein a difference of the refractive indexes between two refractive layers adjacent to each other is less than or equal to 0.2.

15. The light emitting device according to claim 14, wherein the first conductive semiconductor layer comprises a N-type semiconductor layer, and the second conductive semiconductor layer comprises a P-type semiconductor layer.

16. The light emitting device according to claim 14, wherein the plurality of refractive layers comprise a first refractive layer having a first refractive index, a second refractive layer having a second refractive index, and a third refractive layer having a third refractive index.

17. The light emitting device according to claim 16, wherein the active layer emits a light in a blue wavelength band, and wherein the first refractive index is 2.6-2.7, the second refractive index is 2.7-2.8, and the third refractive index is 2.8-3.0 with respect to the light in the blue wavelength band.

18. The light emitting device according to claim 14, wherein the refractive layer is disposed directly on the active layer.

* * * * *